(12) United States Patent
Nash et al.

(10) Patent No.: US 7,589,347 B2
(45) Date of Patent: Sep. 15, 2009

(54) METHOD FOR FABRICATING LATERAL SEMICONDUCTOR DEVICE

(75) Inventors: Geoffrey Richard Nash, Malvern (GB); John Henry Jefferson, Malvern (GB); Keith James Nash, Malvern (GB)

(73) Assignee: Qinetiq Limited (GB)

( * ) Notice: Subject to any disclaimer, the term of this patent is extended or adjusted under 35 U.S.C. 154(b) by 72 days.

(21) Appl. No.: 11/632,934

(22) PCT Filed: Aug. 2, 2005

(86) PCT No.: PCT/GB2005/003021

§ 371 (c)(1),
(2), (4) Date: Jan. 19, 2007

(87) PCT Pub. No.: WO2006/016118

PCT Pub. Date: Feb. 16, 2006

(65) Prior Publication Data

US 2008/0087876 A1     Apr. 17, 2008

(30) Foreign Application Priority Data

Aug. 9, 2004   (GB)   ................................. 0417738.2

(51) Int. Cl.
*H01L 31/00* (2006.01)
(52) U.S. Cl. ................. 257/13; 257/191; 257/E33.048; 438/37
(58) Field of Classification Search .................. 257/13, 257/191; 438/37
See application file for complete search history.

(56) References Cited

U.S. PATENT DOCUMENTS

| | | | | |
|---|---|---|---|---|
| 4,855,255 | A | * | 8/1989 | Goodhue ..................... 117/105 |
| 5,004,698 | A | * | 4/1991 | Norton et al. ................. 438/73 |
| 5,657,338 | A | | 8/1997 | Kitamura |
| 6,083,814 | A | | 7/2000 | Nilsson |
| 6,150,667 | A | * | 11/2000 | Ishizaka et al. ............... 257/21 |
| 6,174,748 | B1 | | 1/2001 | Jeon |
| 2002/0196827 | A1 | | 12/2002 | Shields |
| 2004/0119129 | A1 | * | 6/2004 | Giboney ...................... 257/458 |

FOREIGN PATENT DOCUMENTS

GB      2 354 368      3/2001

OTHER PUBLICATIONS

Nash et al., "Lateral N-I-P Junctions formed in an INSB Quantum Well by Bevel Etching", Semiconductor Science and Technology, IOP Bristol, GB pp. 144-148 (Feb. 2005).
Kaestner et al., "Nanoscale lateral light emitting p-n junctions in AlGaAs/GaAs", Microelectronics Engineering, Elsevier Publishers BV., Amsterdam, NL, vol. 67-68, pp. 797-802 (Jun. 2006).
Foden et al., "High Frequency Acousto-electric Single-photon Source", Physical Review A, APS Through AIP IISA, vol. 62, No. 1, pp. 011803/1-011803/4 (Jul. 2000).
Meier et al. "Problems Related to the Formation of Lateral p-n Junctions on Channeled Substrate (100)GaAs for Lasers", Journal of Vacuum Science and Technology: Part B, American Institute of Physics, vol. 6, No. 1, pp. 692-695 (Mar. 1, 1988).
Ferguson et al., "Determining the Thickness and Composition of SiGe Heterostructures Using an Optical Microscope", Semiconductor Science and Technology, IOP, Bristol, GB, vol. 18, No. 4, pp. 390-392 (Apr. 1, 2003).
Cecchini et al., "High-Performance Planar Light-Emitting Diodes", Applied Physics Letters, vol., 82, n. 4, pp. 636-638 (Jan. 27, 2003).
Ferguson et al., "Beveling Technique for Low Surface Roughness Based on CMP", Electronic Letters, vol. 38, No. 17, (Aug. 15, 2002).

* cited by examiner

*Primary Examiner*—Sue Purvis
*Assistant Examiner*—Benjamin P Sandvik
(74) *Attorney, Agent, or Firm*—McDonnell Boehnen Hulbert & Berghoff LLP

(57) ABSTRACT

A lateral junction semiconductor device and method for fabricating the same comprising the steps of taking a semiconductor structure having a stack formed by a plurality of layers of semiconductor material arranged in a series of substantially parallel planes, the semiconductor material within a first layer having an excess of charge carriers of a first polarity at a first concentration, and selectively removing semiconductor material from the first layer to a depth which varies along a first direction substantially parallel with the planes of the layers within the structure, so as to provide a gradation of the concentration of charge carriers of first polarity within an active layer along the first direction. A photon source comprising said lateral junction semiconductor device.

33 Claims, 5 Drawing Sheets

METHOD FOR FABRICATING LATERAL SEMICONDUCTOR DEVICE

BACKGROUND OF THE INVENTION (1) Field of the Invention

The present invention relates to a method for fabricating lateral junction semiconductor devices. More specifically, the present invention is concerned with a method for fabricating lateral junction optoelectronic semiconductor devices, and in particular solid state single photon source (SPS) devices.

(2) Description of the Art

Conventional, or vertical, light emitting p-n junctions are difficult to integrate with planar devices such as transistors or resistors. Lateral p-n junctions are not only easier to combine with other devices, but may also have superior characteristics. For example, in laser diodes, electrons and holes are injected into the active area through higher band-gap layers, which provide optical confinement. This limits the modulation bandwidth as the carriers have an unnecessary excess energy, which increases their radiative recombination time. Additional advantages of lateral junctions include smaller junction area and junction capacitance, and co-planar contacts.

An example of an optoelectronic device based on a lateral p-n junction configuration is the solid state single photon source (SPS) described in patent GB2354368.

A variety of conventional approaches for fabricating lateral p-n junctions exist. For example, devices based on the amphoteric nature of silicon in gallium arsenide (GaAs), where the silicon either gives n-type or p-type doping depending on the substrate orientation, are known (D. L. Miller, Appl. Phys. Lett. 47, 1309 (1985) refers). Several groups have reported luminescence in such devices. See for example the following references:

T. Saiki, S. Mononobe, M. Ohhtsu, N. Saito, and J. Kusano, Appl. Phys. Lett. 67, 2191 (1994).

P. O. Vaccaro, H. Ohnishi, and K. Fujita, Appl. Phys. Lett. 72, 818 (1982).

A. North, J. Burroughes, T. Burke, A. Shields, C. E. Norman, and M. Pepper, IEEE J. Quantum Electron. 35, 352 (1999).

However, this technique is complicated, as it requires the growth, selective removal, and re-growth of semiconductor material.

Focused Ion Molecular Beam Epitaxy has also been suggested as a technique for fabricating lateral junctions but, in common with the technique described above, is complicated and requires specialist equipment (see P. J. A. Sazio, S. Vijendran, W. Yu, H. E. Beere, G. A. C. Jones, E. H. Linfield, and D. A. Ritchie, J. Crystal Growth 201/202, 12 (1999)).

More recently, Kaestner et. al. have reported a method of forming a lateral p-n junction in an undoped, low band gap channel (Jpn. J. Appl. Phys., Part 1 41, 2513 (2002), and Microelectron. Eng. 67-68, 797 (2003) refer). Carriers of both types are introduced into the channel from either side via doped high band gap layers that are parallel to the surface. In the as-grown state, one carrier type is fully depleted, whereas if the upper highly doped region is removed by etching, the carrier type that was previously depleted collects at the interface between the high and low band gap layers. A p-n junction in the low band gap channel therefore forms below the edge of the etched region.

A similar scheme was reported by Cecchini et. al. (M. Cecchini, V. Piazza, F. Beltram, M. Lazzarino, M. B. Ward, A. J. Shields, H. E. Beere, and D. A. Ritchie, Appl. Phys. Lett. 82, 636 (2003)), except that the low band gap channel was initially doped p-type via a doped high band gap layer parallel to the surface. A region of the doped high band gap layer was then etched away, and an n-type contact was evaporated to give an n-type region in the low band gap channel.

However, both of these schemes rely on accurate etching of the doped layers so that the channel itself isn't either destroyed or fully depleted.

SUMMARY OF THE INVENTION

It is an object of the invention to provide an alternative method for fabricating a lateral junction semiconductor device and in particular a method which mitigates at least some of the disadvantages of the foregoing methods.

According to a first aspect of the present invention there is now proposed a method for fabricating a lateral junction semiconductor device comprising the steps of (i) taking a semiconductor structure having a stack formed by a plurality of layers of semiconductor material arranged in a series of substantially parallel planes, the semiconductor material within a first layer having an excess of charge carriers of a first polarity at a first concentration, and (ii) selectively removing semiconductor material from the first layer to a depth which varies along a first direction substantially parallel with the planes of the layers within the structure, so as to provide a gradation of the concentration of charge carriers of first polarity within an active layer along the first direction.

The step in the above method of selectively removing semiconductor material has synergy with a process of bevel etching semiconductor samples prior to characterisation. However, bevel etching has hitherto been used only as a technique for preparing semiconductor samples prior to characterisation using, for example, Secondary Ion Mass Spectroscopy (SIMS), Auger electron spectrometry (AES), spreading resistance analysis (SRA), Raman Spectroscopy, Photoluminescence Spectroscopy, or Kelvin Force Microscopy.

The present invention lies in the realisation that a lateral semiconductor junction may be fabricated by imparting an excess of charge carriers of a first polarity to a semiconductor structure and selectively removing material from said structure using, for example, a technique similar to conventional bevel etching.

In contrast to conventional bevel etching, the present invention utilises a process in which semiconductor material is selective removed from a structure in order to fabricate a semiconductor device (rather than as a post fabrication technique for assessing an existing structure).

The method of the invention involves a new and surprising effect, namely the depth to which semiconductor material is selectively removed from the first layer does not have to be controlled precisely during the fabrication process. The present method ensures that a semiconductor structure having a requisite band configuration inherently exists somewhere along the first direction, the only requirement being that the first layer having excess charge carriers is not completely removed during the process. The processing requirements of the present method are thus relaxed over conventional methods which typically require at least one etch stop layer within the device structure in order to halt a conventional mesa etch at a predefined critical depth. Failure to halt a conventional mesa etch at a predefined depth can result in the destruction of the semiconductor device under construction. In contrast, variations in depth produced by the present method merely alter the lateral position of the requisite band configuration along the first direction.

In keeping with conventional semiconductor theory, the excess charge carriers shall comprise carriers having either a negative polarity (electrons) or a positive polarity (holes). The excess charge carriers may be introduced into the device by the use of extrinsic semiconductor materials, for example doped materials.

In keeping with standard semiconductor nomenclature, the active layer is the part of the semiconductor in which electrons and holes are most likely to radiatively recombine under the application of an electric field along the first direction.

Advantageously, the step of selectively removing semiconductor material from the first layer comprises a process of tapering the thickness of the first layer along the first direction. This provides a series of concentration levels of charge carriers within the gradation (i.e. more than two concentration levels).

Preferably, the layers of semiconductor material within the stack are arranged to form at least one heterostructure. At least two of the layers within the stack may comprise semiconductor material having different band gaps. For example, the active layer and an abutting layer may comprise semiconductor material having different band gaps.

In a preferred embodiment, the first concentration and the depth to which the semiconductor material is selectively removed are arranged to co-operate such that the concentration of excess charge carriers of first polarity within the gradation increases from a minimum of substantially zero.

Optionally, the depth beneath the surface, the thickness of the first and active layers, and the spacing there-between are arranged to co-operate with the first concentration and the depth to which the semiconductor material is selectively removed such that the concentration of excess charge carriers of first polarity within the gradation increases from a minimum of substantially zero.

In an another preferred embodiment, the concentration of excess charge carriers of first polarity within the gradation varies substantially linearly from the minimum to a maximum along the first direction.

The step of taking the semiconductor structure may comprise the intermediate step of imparting an excess of charge carriers of first polarity at the first concentration to the semiconductor material within the first layer of the stack. For example, the step of imparting an excess of charge carriers of first polarity may comprise the step of introducing a dopant species into the semiconductor structure.

The dopant species may be introduced into the semiconductor material comprising the first layer.

The step of introducing the dopant species may comprise at least one of slab doping and delta doping during crystal growth, for example using molecular beam epitaxy (MBE). Using growth techniques such as MBE, dopant species can be introduced during growth, and their distribution accurately controlled. Alternatively, dopant species could be introduced, after growth, using techniques such as ion implantation and diffusion.

Advantageously, the dopant species comprises a p-type dopant.

In a further preferred embodiment, the semiconductor material within a second layer has an excess of charge carriers of a second polarity at a second concentration, the first and second concentrations and the depth to which the semiconductor material is selectively removed from the first layer being arranged to co-operate such that the concentration of excess charge carriers predominating within the active layer varies from those of the first polarity to those of the second polarity along the first direction. In one embodiment the active and second layer are the same.

In this case the method may comprise the intermediate step of imparting an excess of charge carriers of second polarity at the second concentration to the semiconductor material within the second layer of the stack. For example, the step of imparting an excess of charge carriers of second polarity may comprise the step of introducing a dopant species into semiconductor structure.

The dopant species may be introduced into the semiconductor material comprising the second layer.

The step of introducing the dopant species may comprises at least one of slab doping and delta doping during crystal growth.

Advantageously, the dopant species comprises a n-type dopant.

Advantageously, the first and second concentrations and the depth to which the semiconductor material is selectively removed from the first layer are arranged to co-operate so as to provide within the active layer a region having substantially no excess charge carriers interposed along the first direction between a region having a predominance of excess charge carriers of first polarity and a region having a predominance of excess charge carriers of second polarity.

Optionally, the depth beneath the surface, the thickness of the first, second and active layers, and the spacing there-between are arranged to co-operate with the first and second concentrations and the depth to which the semiconductor material is selectively removed from the first layer so as to provide within the active layer a region having substantially no excess charge carriers interposed along the first direction between a region having a predominance of excess charge carriers of first polarity and a region having a predominance of excess charge carriers of second polarity.

The present method is advantageous in that, subject to selection of suitable concentrations of the excess carriers in the first and second layers, a p-i-n lateral semiconductor junction inherently arises as a result of the selective removal of material from the first layer. The method ensures that the correct doping profile is achieved within the device somewhere along the first direction, irrespective of the depth to which material is removed (as long as the first layer is not completely removed from the device). In practice, the first layer may be removed along part of the first direction. Moreover, part of the structure underlying the first layer (e.g. the second layer) may be removed without compromising the performance of the device.

In the interests of clarity, the region having substantially no excess charge carriers may comprise intrinsic or extrinsic semiconductor.

Preferably, the method described above comprises forming a semiconductor structure wherein the active layer is arranged between the first and second layers, and the band gap of the active layer is arranged to be less than the band gap of the first and second layers. In this case, the structure is designed such that excess charge in the first and second layers is transferred into the active layer.

Advantageously, the active layer comprises a substantially intrinsic semiconductor material. This improves carrier mobility within the active layer by eliminating donor/acceptor impurities which could otherwise act as recombination centres, carrier traps and scattering centres. The high frequency and optical performance of the device is thereby enhanced. In this configuration, excess carriers are preferably introduced into the active layer from the first and second layers.

Advantageously, the active layer is separated from the first and second layers by undoped spacer layers, which have the same band-gap of the first and second layers. The dopant ions are therefore spatially separate from the mobile carriers in the active layer, and the scattering from these ions is therefore minimised.

In another embodiment, the semiconductor structure comprises a double heterostructure arranged in a quantum well configuration.

Conveniently, the tapering process is arranged to impart an outer surface to the stack inclined at an angle to the planes of layers therein.

In a preferred embodiment, the tapering process is arranged to impart an outer surface inclined at an angle of $10^{-1}$-$10^{-5}$ radians to the planes of the layers within the stack.

In another preferred embodiment, the tapering process comprises at least one of mechanical lapping, laser ablation, plasma bevelling, ion beam bevelling, chemical-mechanical polishing, and chemical bevelling.

Advantageously, the tapering process comprises chemical bevelling with bromine ethylene glycol etchant.

Preferably, the concentration of the bromine is 1%-10%. The etch rate is conveniently arranged to be in the range 0.1 µm/minute to 1 µm/minute. In practice, the method preferably comprises the step of lowering the semiconductor structure into the etchant at a controlled rate in the range 0.25 mm/minute-100 mm/minute; typically at a rate of about 3 mm/minute.

In a preferred embodiment, the method comprises the further step of attaching connecting means to the structure. The connecting means may comprise at least one of electrical connections and optical connections.

According to a second aspect of the present invention, there is now proposed a lateral junction semiconductor device comprising a semiconductor heterostructure having a stack formed by a plurality of layers of semiconductor material arranged in a series of substantially parallel planes, a first layer therein having a thickness which tapers along a first direction substantially parallel with the planes of the layers, said first layer comprising a semiconductor material having an excess of charge carriers of a first polarity at a first concentration, wherein the first concentration and the tapering thickness are arranged to co-operate so as to provide a gradation of concentration of charge carriers of first polarity within an active layer along the first direction.

In a preferred embodiment, the first concentration and the tapering thickness are arranged to co-operate such that the concentration of excess charge carriers of first polarity within the gradation increases from a minimum of substantially zero. Preferably, the concentration of excess charge carriers of first polarity within the gradation varies substantially linearly from the minimum to a maximum along the first direction.

In another preferred embodiment, the semiconductor material within a second layer has an excess of charge carriers of a second polarity at a second concentration, the first and second concentrations and the tapering thickness being arranged to co-operate such that the concentration of excess charge carriers predominating within the active layer varies from those of the first polarity to those of the second polarity along the first direction.

In a further preferred embodiment, the first and second concentrations and the tapering thickness are arranged to co-operate so as to provide within the active layer a region having substantially no excess carriers interposed along the first direction between a region having a predominance of excess charge carriers of first polarity and a region having a predominance of excess charge carriers of second polarity.

In the interests of clarity, the region having substantially no excess charge carriers may comprise intrinsic or extrinsic semiconductor.

In this embodiment of the invention, the semiconductor device preferably comprises a semiconductor structure wherein the active layer is arranged between the first and second layers, and the band gap of the active layer is arranged to be less than the band gap of the first and second layers.

Advantageously, the active layer comprises a substantially intrinsic semiconductor material. This improves carrier mobility within the active layer by eliminating donor/acceptor impurities which could otherwise act as recombination centres, carrier traps and scattering centres. The high frequency and optical performance of the device is thereby enhanced. In this configuration, excess carriers are preferably introduced into the active layer from the first and second layers.

Advantageously, the active layer is separated from the first and second layers by undoped spacer layers, which have the same band-gap of the first and second layers. The dopant ions are therefore spatially separate from the mobile carriers in the active layer, and the scattering from these ions is therefore minimised.

Conveniently, the semiconductor structure comprises a double heterostructure arranged in a quantum well configuration.

Preferably, the tapering thickness imparts an outer surface to the stack inclined at an angle to the planes of the layers there within. Even more preferably, the outer surface is inclined at an angle of $10^{-1}$-$10^{-5}$ radians to the planes of the layers within the stack.

According to a third aspect of the present invention, there is now proposed a photon source having a lateral junction semiconductor device according to the second aspect of the present invention, further comprising means for creating a surface acoustic wave travelling along the first direction such that, in use, the mobile carriers are transported by the surface acoustic wave along the first direction; and means for controlling the carrier transport caused by the wave such that the number of mobile carriers so transported can be controlled to the accuracy of a single carrier.

Where the lateral junction semiconductor device according to the second aspect of the present invention has excess charge carriers of a single polarity only, the photon source preferably further comprises at least one of electrical means and optical means for introducing mobile carriers into the device. Accordingly, mobile carriers having opposite polarity to those within the first layer may be introduced into the device by the at least one electrical and optical means.

Advantageously, the means for controlling the carrier transport comprise at least one of a biasable split gate and a quantum point contact.

DESCRIPTION OF THE FIGURES

The invention will now be described, by example only, with reference to the accompanying drawings in which;

FIGS. 6a and 6c illustrate the variation of electron potential versus etch depth for the embodiments shown in FIG. 5. Specifically, FIG. 6a refers to an indium antimonide (InSb) device whereas FIG. 6c illustrates the variation of electron potential in the cadmium mercury telluride (HgCdTe) device.

DESCRIPTION OF A PREFERRED EMBODIMENT

Figure 1:
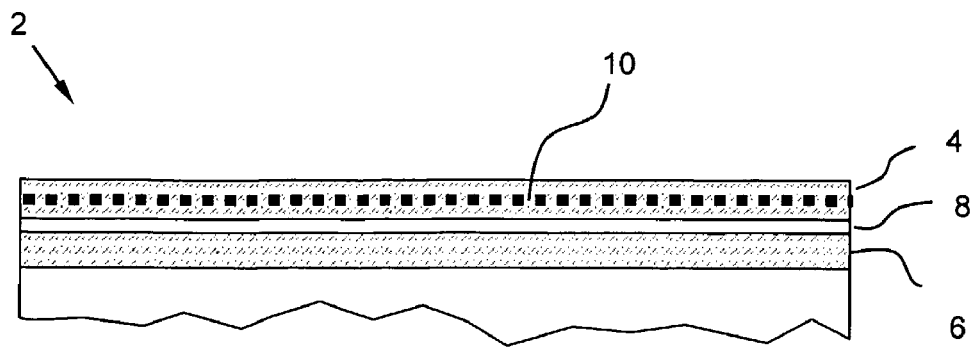
FIG. 1 shows a schematic cross sectional representation of a partially fabricated lateral junction semiconductor device according to a first embodiment of the present invention. The figure illustrates the semiconductor structure prior to processing to impart a taper to the upper layer of the structure.
Figure 2:
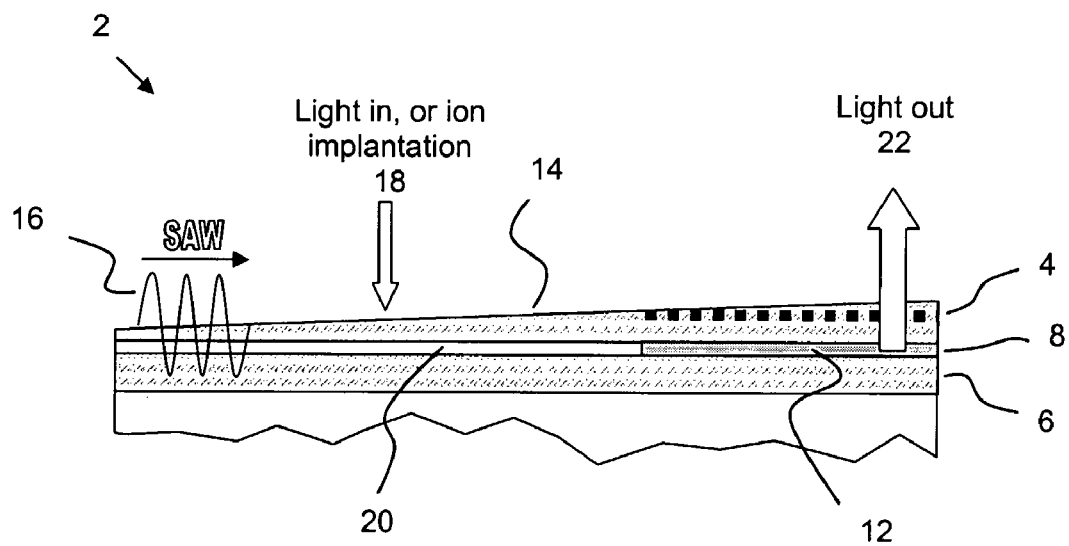
FIG. 2 shows a schematic cross sectional representation of the completed lateral junction semiconductor device according to the first embodiment of the invention. The device depicted in FIG. 2 comprises a single photon source.

Referring to FIGS. 1 and 2, a first embodiment of the invention shall now be described comprising a single photon source device and method for fabricating the same. The device 2 is based on epitaxial growth of semiconductor layers onto a single crystal substrate, and a schematic cross-section of the proposed device after growth is shown in FIG. 1. The top 4 and bottom 6 layers are grown such that they have a larger bandgap than the middle layer 8. This is achieved by growing layers of different composition so, for example, the top and bottom layers shall be AlGaAs, and the middle layer GaAs. Other suitable material systems include, but are not limited to, $Hg_{1-x}Cd_xTe$ and InGaAs/InGaAsP.

The device 2 illustrated in FIG. 1 utilises a quantum well structure wherein the carrier wavefunction falls rapidly to zero away from the middle layer. The electrons (or holes) in the quantum well form a 2D sheet by mainly occupying the lowest energy standing wave in the direction perpendicular to the plane of the well. However, the following discussion is not limited to quantum well structures and is also applicable to carriers trapped at a heterojunction.

The top layer 4 of the device 2 is p-doped during the growth, with the acceptors lying in a thin sheet 10 (commonly know as δ-doping) which is close enough to the quantum well to ensure that the charge carriers are transferred into the well. The device is then bevel etched, as shown in FIG. 2, so that part of the δ-doped layer 10 is removed. This leaves only one part 12 of the quantum well that is doped, as shown to the right in FIG. 2. Wet chemical etching is typically used to create the bevel, so that little physical damage is done to the quantum well. However, the method of the present invention is not limited to wet etching and it would be apparent to the skilled person that alternative process could be used to create the bevel, for example ion beam milling, mechanical lapping or chemical-mechanical polishing.

In many circumstances, chemical bevel etching is attractive as it does not roughen the as-grown material, relies on relatively simple equipment, and can be easily be applied to a range of materials, including CdTe, InP, GaAs, and InGaN. Chemical bevel etching is accomplished by gradually lowering samples into the etching solution, or alternatively by gradually covering samples with the etching solution. Typically the bevel angle is extremely small (in the range $10^{-1}$-$10^{-5}$ radians), but can be varied by altering the etch conditions. Different etch rates of the various layers constituting a sample, or changes in etch rate as the etching constituents are consumed, can lead to non-linear bevel. However, this can be compensated for by using a computer controlled system.

The angle of the bevel is arranged to be small enough to ensure that there is a large (many tens of micrometres) region of undoped quantum well remaining. Finally an interdigital transducer (not shown) is deposited on the surface of the far left-hand side of the device, and a split gate 14 is deposited on the surface over the undoped region of the quantum well as indicated in FIG. 2.

To operate the device a surface acoustic wave (SAW) 16 is excited, using the interdigital transducer, which propagates from the left-hand side to the right hand side of the device 2, simultaneously transporting charge along the quantum well. In one form of the device electrons and holes are optically excited by applying light 18 to the structure 2 (for example using a laser) in the quantum well, and become confined in the moving lateral potential wells associated with the SAW. In another form of the device, the left-hand side of the device 20 is doped n-type, for example using ion-implantation, after the bevel etching. It should be noted that the ion implantation could be carried out over a localised area of the device, to the left of the interdigital transducer, to avoid damage to the quantum well. In this case the SAW 16 only transports electrons, but the overall operation of both forms of the device would be similar. In use, the split-gate 14 is negatively biased so that only one electron would be allowed through in each SAW cycle. This bias may be changed to compensate for any build-up of holes that might occur at the split-gate 14. The doping of the δ-doping layer 10 is chosen to be sufficiently large that as the SAW 16 enters the right hand side of the device it is rapidly attenuated by the holes, thus allowing the trapped electron to escape. The electron recombines to emit a single photon 22. The high p-doping of the quantum well in this region 12 of the device ensures that the radiative recombination process is sufficiently fast. It is important to realise that a train of single photons is produced if τ<<T, where τ is the recombination time and T is the SAW period (typically ns). This will therefore give an antibunched train of photons if the hole doping is large enough to attenuate the SAW sufficiently to ensure a large electron-hole wavefunction overlap, and also to give a rapid recombination time (proportional to the number of holes). However, focusing and de-focusing of the SAW 16 could be used to vary the SAW amplitude in different parts of the device. The angle of the bevel may also be used to control the recombination process. Finally, Ohmic contacts to both the n and p-region may be required to prevent charge build-up.

Figure 3:
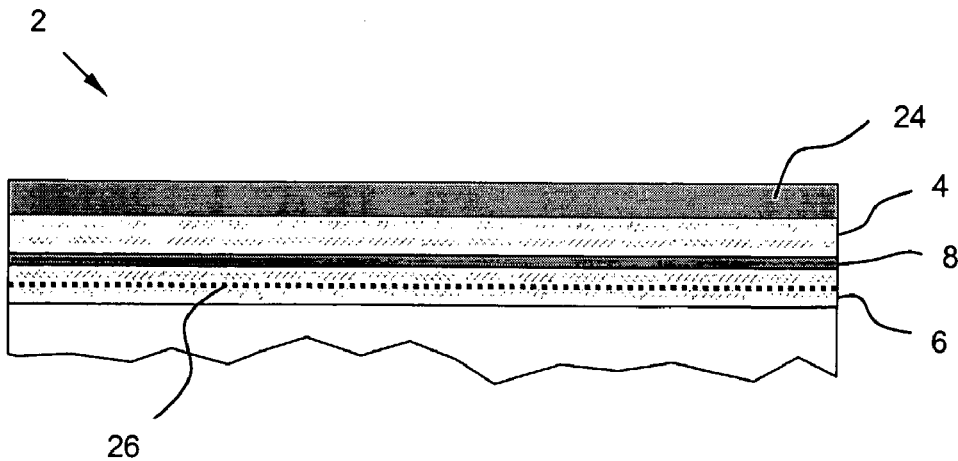
FIG. 3 shows a schematic cross sectional representation of a partially fabricated double heterostructure device according to another embodiment of the present invention. In this embodiment, the lateral junction device is based upon a quantum well configuration.
Figure 4:
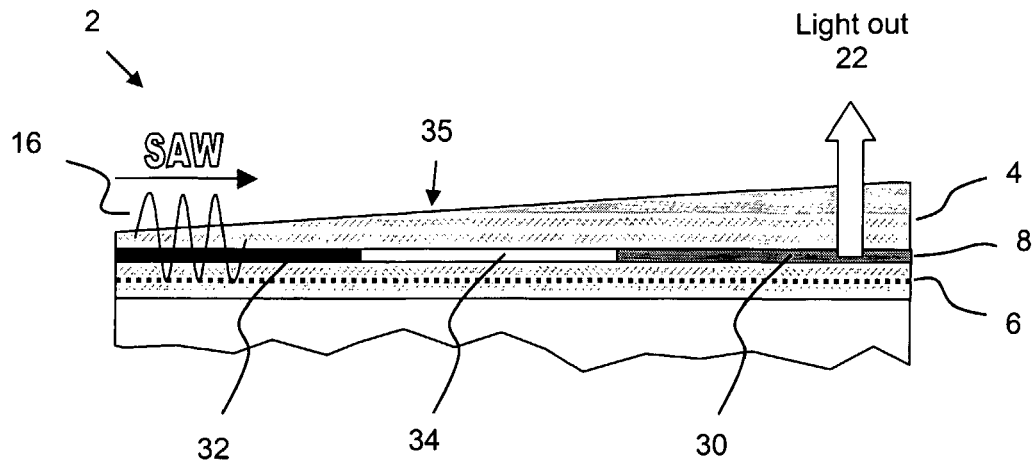
FIG. 4 shows a schematic cross sectional representation of the double heterostructure device of FIG. 3 after bevel etching.

Referring now to FIGS. 3 and 4, a second embodiment of the invention shall now be described comprising an alternative single photon source 2 device to that described in the foregoing and method for fabricating the same. To avoid unnecessary repetition, like features which have been described with reference to FIGS. 1 and 2 have been give the same reference numerals.

The development of true photon sources is of fundamental scientific and technological importance, and in this second embodiment of the present invention single electrons are injected into the p-type region of a lateral p-i-n junction. In this embodiment the single photon source 2 is electrically driven. The device has potential advantages over conventional sources, namely the potential to operate at relatively high frequencies, the ability to produce many parallel photon trains, and the possibility that single photons are emitted with a known polarisation (the latter two are highly desirable properties with respect to quantum cryptography).

The single photon source 2 according to this second embodiment comprises a generic double heterostructure configuration as shown in FIG. 3. The device described hereunder is constructed using either III-V materials or II-IV materials. A self-consistent Schrödinger-Poisson solver was used to design InSb and HgCdTe quantum well device layers, based upon the generic structure shown in FIG. 3. The top layer 4 of the device 2 is p-doped 24 during the growth using slab doping or modulation doping. The bottom layer 6 of the device 2 is n-doped during the growth, with the donors lying in a thin sheet 26 (commonly know as δ-doping) which is close enough to the quantum well to ensure that the charge carriers are transferred into the well. The levels of p and n doping are carefully chosen so that the quantum well is initially p-type everywhere. A schematic diagram of the device after bevel etching is shown in FIG. 4. One end 30 of the well remains p-doped, as in the as-grown structure, whereas a region 32 of the well becomes n-type at some point near where the p dopants are removed 35. At some point in-between, the n and p-doping cancel out, leaving a substantially intrinsic region 34. The doping levels within the device and the shallow angle of the bevel etched upper layer 4 provide a slowly varying potential within the device which ensures that single electrons remain trapped in the potential minima associated with the SAW as they are transported from the n to the p-regions.

Figure 5:
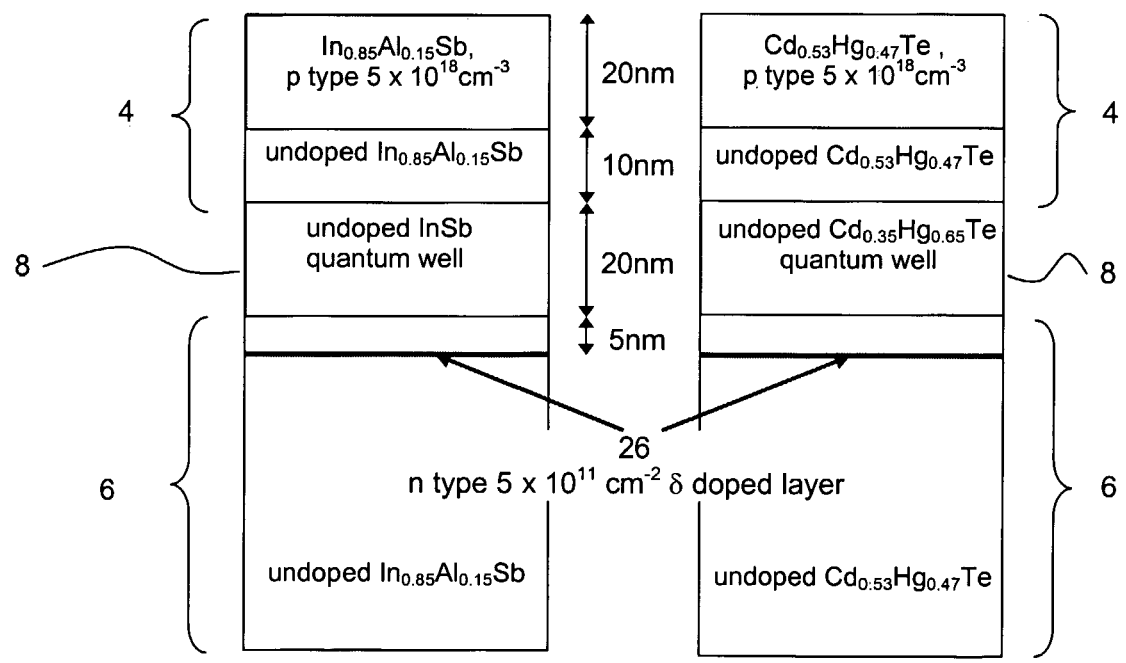
FIG. 5 shows schematic cross sectional representations of further embodiments of the invention comprising designs for lateral light emitting diode based on indium antimonide (InSb) and cadmium mercury telluride (HgCdTe) respectively.

FIG. 5 shows a schematic diagram of the detailed InSb and HgCdTe device structures. In this case, the HgCdTe quantum well 8 has a composition designed to give emission in the mid-IR, although as HgCdTe is a lattice matched system this could easily be changed, for example to give emission at 1.55 μm.

Figure 6A:
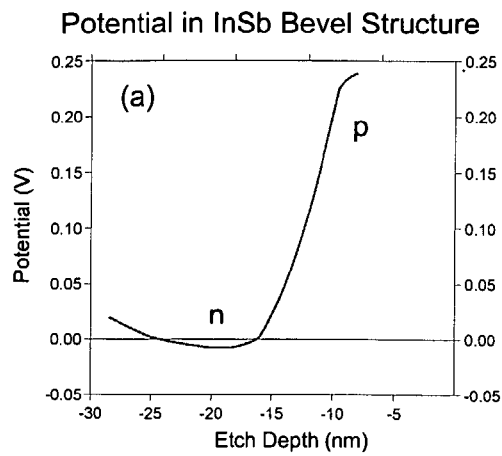
Figure 6B:
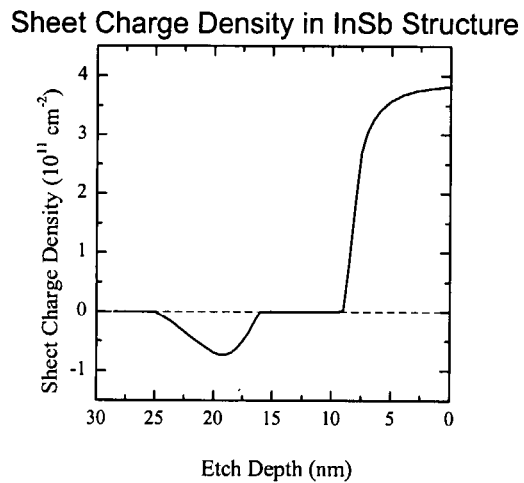
FIG. 6b shows a plot of sheet charge density as a function of etch depth for the indium antimonide (InSb) structure.
Figure 6C:
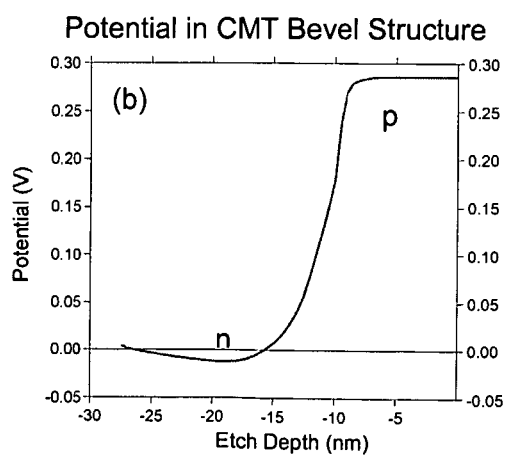

In FIGS. 6(*a*) and 6(*c*), the electron potential is plotted, as the minimum energy of the first electron subband in the quantum well, as a function of etch depth for the InSb and HgCdTe cases respectively. These plots illustrate that after bevel etching, the quantum well contains both n-type and p-type regions. In FIG. 6(*b*), the sheet charge density within the quantum well is plotted as a function of etch depth for the InSb structure. This confirms the formation of n-type and p-type regions after bevel etching which, in this case, are separated by a near-intrinsic region.

In common with the foregoing embodiments, chemical bevel etching was used to introduce bevels into a range of test samples, although alternative processing techniques may be applicable as mentioned above.

Figure 7:
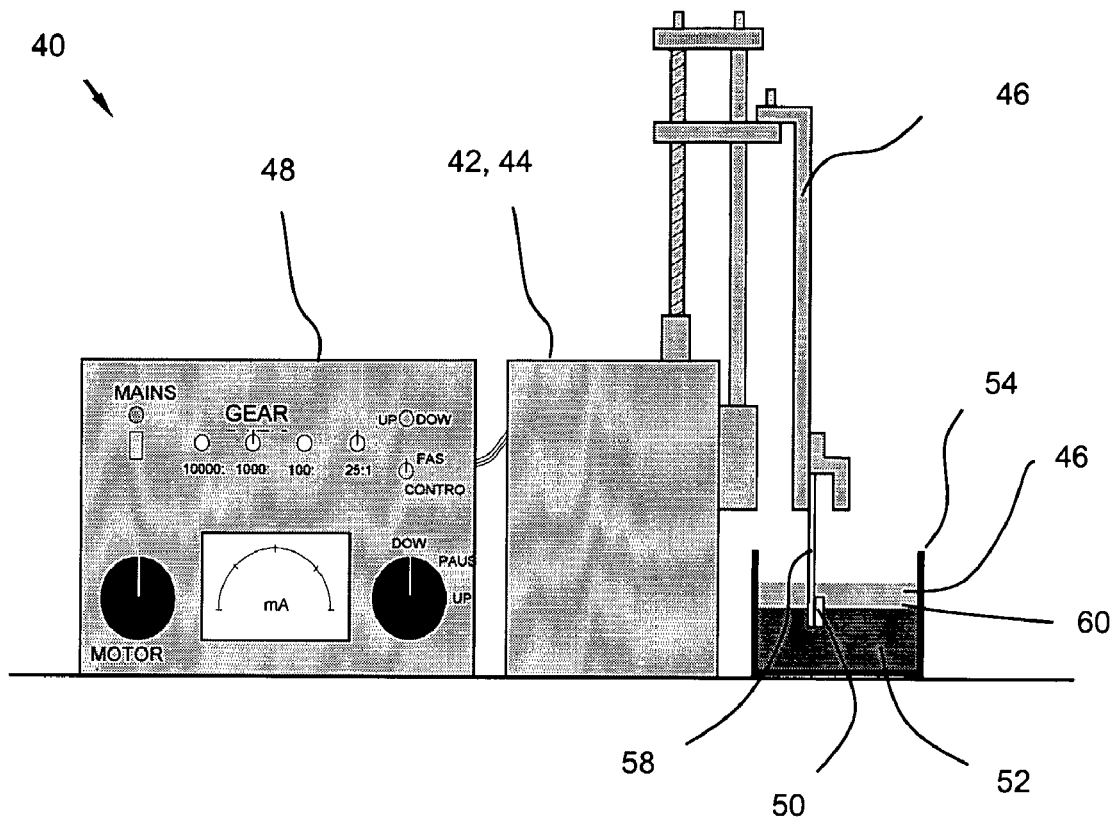
FIG. 7 shows a schematic representation of the bevel etch equipment used in one embodiment of the method according to the invention.

FIG. 7 shows a schematic diagram of the equipment 40 used to fabricate the aforementioned devices. An electric motor 42 is used to raise and lower a rod 44, via a gearbox 46, on which the sample 50 to be etched is attached. The current used to drive the motor 42 and the gear ratio 46 can be varied using a controller 48, so that the rod 44 can be smoothly lowered at rates between ~0.25 mm/minute and ~100 mm/minute. The rate that the rod 44 is lowered determines both the length of the bevel, and, together with the chemical etches rate, the depth of the bevel. Typically, rates of ~3 mm/min are used.

The etchant 52 is prepared in a beaker 54 and left to stand at room temperature for 20 minutes before etching. Immediately prior to etching a layer of solvent 56 is pipetted slowly onto the etchant 52. This prevents vapour etching and a meniscus forming across the sample 50. The solvent 56 and etchant 52 are chosen to be immiscible, so that there is little mixing between the layers. For InSb and HgCdTe etching, we use ethylene glycol and bromine ethylene glycol for the solvent and etchant respectively.

The concentration of the bromine determines the etch rate, but typically we have used concentrations between 1% and 10%, which give etch rates of between 0.1 mm/minute to 1 μm/minute.

The sample to be etched is mounted onto a glass slide 58, and attached to the rod 46. To begin etching the sample 50 is then lowered into the beaker 56 to the solvent/etchant interface 60.

Figure 8:
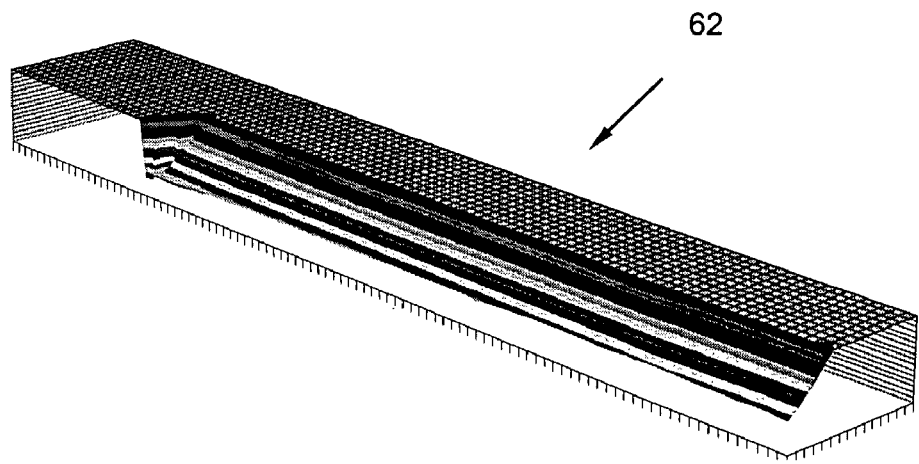
FIG. 8 shows a two dimensional surface profile of a HgCdTe test device patterned using chemical bevel etching.

FIG. 8 shows a 2D surface profile of a HgCdTe test device 62 patterned using bromine/ethylene glycol bevel etching. The etch depth was determined by measuring the step height between a strip of the device that was masked off using photoresist and the deepest part of the bevel, and was ~4 μm. The length of the bevel was ~3 mm (note that the image has been compressed in the direction of the bevel for so that the bevel can be clearly seen). The average surface roughness of the etched surface was measured as 20 nm, which was approximately the same as the unetched surface. Different etchants and solvents can be used for different materials, although the bromine ethyleneglycol combination is known to also give good results when used for InGaAs/InP.

Figure 9:
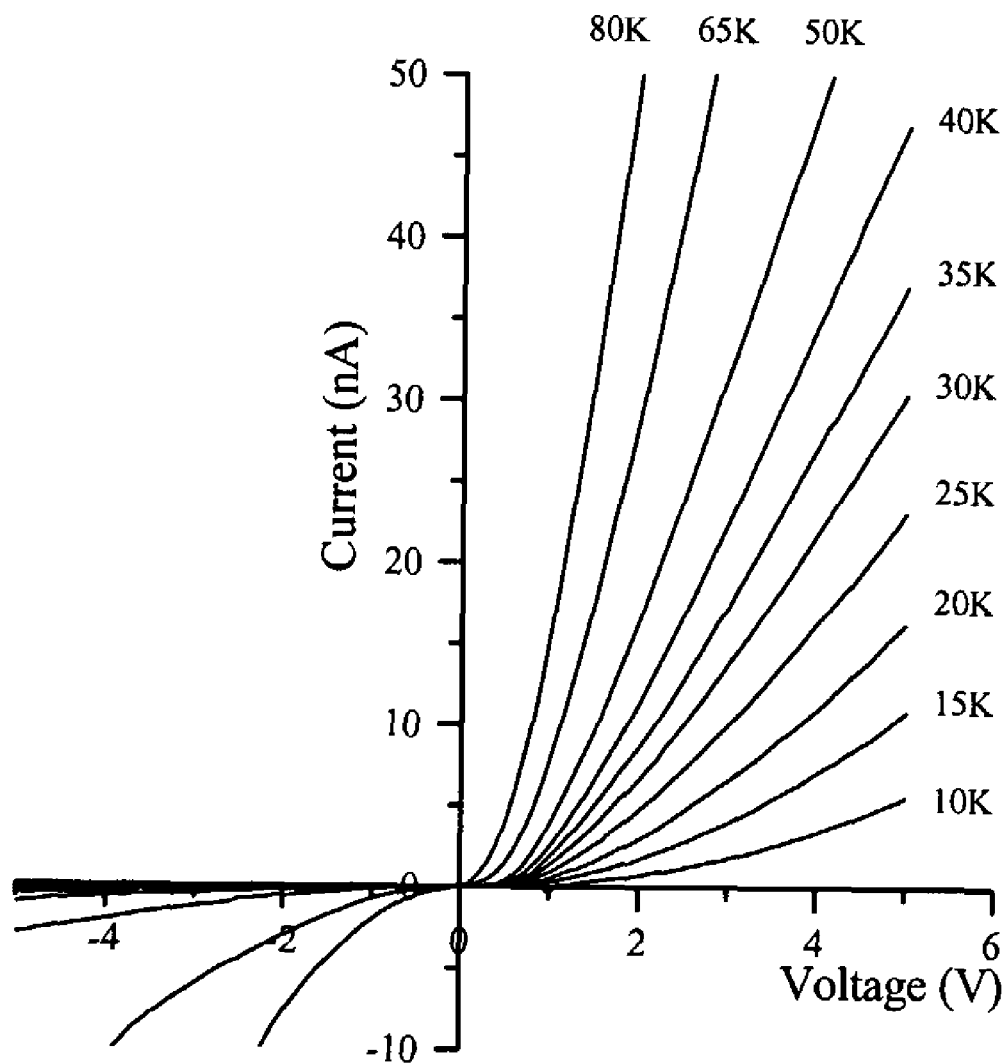
FIG. 9 shows the current-voltage characteristic of a lateral p-n junction fabricated from InSb according to the design shown in FIG. 5, measured as a function of temperature. The highly non-linear characteristic suggests that a lateral junction has been formed.

FIG. 9 shows a measured current-voltage characteristic from a device fabricated using the techniques according to the present invention. An InSb wafer was grown on a GaAs substrate, following the design shown in FIG. 5, using molecular beam epitaxy, and was processed using the bevel etching apparatus shown in FIG. 7. An array of Ohmic contacts were deposited on the surface of the device after the etching, and FIG. 9 shows the I-V characteristic measured from a pair of Ohmic contacts, where one is thought to contact to the p-region of the quantum well, and one to the n-type region of the well. Positive voltages correspond to the case where the Ohmic contact on the p-side was positive compared to the Ohmic contact on the n-side, and this case the current initially increases almost exponentially with applied voltage. In contrast, when the voltage was reversed the current is both much smaller and is relatively independent of applied voltage. The strong dependence of the current flow on the polarity of the applied voltage is consistent with the fact that a lateral p-n junction has been formed.

Laser microscopy was also used to characterise the lateral junction in the foregoing InSb quantum well device. Micrometre-scale resolution photoresponse scans taken with both visible (633 nm) and mid-infrared (mid-IR) (1.4 μm) lasers showed areas of high-amplitude signal which lay between the n-type and p-type contacts, confirming the existence of a lateral p-i-n junction. When the mid-IR laser was used, the spatial distribution of the high-amplitude signal was smaller than in the case when visible illumination was used. As the mid-IR can only excite transitions within the quantum well, this suggests that the junction is located in the quantum well.

The foregoing embodiments of the invention have been described in terms of double heterostructure devices and in particular single photon sources, however it will be evident to the skilled person that the method of the present invention is also applicable to the fabrication of other devices for example semiconductor lasers. The method is also suited to fabricating single heterostructure devices for example p-n junction devices, e.g. light emitting diodes.

The invention claimed is:
1. A method for fabricating a lateral junction semiconductor device comprising the steps of
   (i) taking a semiconductor structure having a stack formed by a plurality of layers of semiconductor material arranged in a series of substantially parallel planes, the semiconductor material within a first layer having an excess of charge carriers of a first polarity at a first concentration, and
   (ii) selectively removing semiconductor material from the first layer to a depth which varies along a first direction substantially parallel with the planes of the layers within the structure, so as to provide a gradation of the concentration of charge carriers of first polarity within an active layer along the first direction.

2. A method according to claim 1 wherein the step of selectively removing semiconductor material from the first layer comprises a process of tapering the thickness of the first layer along the first direction.

3. A method according to claim 1 wherein the layers of semiconductor material within the stack are arranged to form at least one hetero structure.

4. A method according to claim 1 wherein the first concentration and the depth to which the semiconductor material is selectively removed are arranged to co-operate such that the concentration of excess charge carriers of first polarity within the gradation increases from a minimum of substantially zero.

5. A method according to claim 1 wherein the concentration of excess charge carriers of first polarity within the gradation varies substantially linearly from the minimum to a maximum along the first direction.

6. A method according to claim 1 wherein the step of taking the semiconductor structure comprises the intermediate step of imparting an excess of charge carriers of first polarity at the first concentration to the semiconductor material within the first layer of the stack.

7. A method according to claim 6 wherein the step of imparting an excess of charge carriers of first polarity comprises the step of introducing a dopant species into the semiconductor structure.

8. A method according to claim 1 wherein the semiconductor material within a second layer has an excess of charge carriers of a second polarity at a second concentration, the first and second concentrations and the depth to which the semiconductor material is selectively removed from the first layer being arranged to co-operate such that the concentration of excess charge carriers predominating within the active layer varies from those of the first polarity to those of the second polarity along the first direction.

9. A method according to claim 8 comprising the intermediate step of imparting an excess of charge carriers of second polarity at the second concentration to the semiconductor material within the second layer of the stack.

10. A method according to claim 9 wherein the step of imparting an excess of charge carriers of second polarity comprises the step of introducing a dopant species into semiconductor structure.

11. A method according to claim 8 wherein the first and second concentrations and the depth to which the semiconductor material is selectively removed from the first layer are arranged to co-operate so as to provide within the active layer a region having substantially no excess charge carriers interposed along the first direction between a region having a predominance of excess charge carriers of first polarity and a region having a predominance of excess charge carriers of second polarity.

12. A method according to claim 11 comprising forming a semiconductor structure wherein the active layer is arranged between the first and second layers, and the band gap of the active layer is arranged to be less than the band gap of the first and second layers.

13. A method according to claim 1 wherein the active layer comprises a substantially intrinsic semiconductor material.

14. A method according to claim 12 wherein the semiconductor structure comprises a double heterostructure arranged in a quantum well configuration.

15. A method according to claim 2 wherein the tapering process is arranged to impart an outer surface to the stack inclined at an angle to the planes of layers therein.

16. A method according to claim 15 wherein the tapering process is arranged to impart an outer surface inclined at an angle of $10^{-1}$-$10^{-5}$ radians to the planes of the layers within the stack.

17. A method according to claim 2 wherein the tapering process comprises at least one of mechanical lapping, laser ablation, plasma bevelling, ion beam bevelling, chemical-mechanical polishing, and chemical bevelling.

18. A method according to claim 17 wherein the tapering process comprises chemical bevelling with bromine ethylene glycol etchant.

19. A method according to claim 18 wherein the concentration of the bromine is 1%-10%.

20. A method according to claim 18 having an etch rate of 0.1 μm/minute to 1 μm/minute.

21. A lateral junction semiconductor device comprising a semiconductor heterostructure having a stack formed by a plurality of layers of semiconductor material arranged in a series of substantially parallel planes, a first layer therein having a thickness which tapers along a first direction substantially parallel with the planes of the layers, said first layer comprising a semiconductor material having an excess of charge carriers of a first polarity at a first concentration, wherein the first concentration and the tapering thickness are arranged to co-operate so as to provide a gradation of concentration of charge carriers of first polarity within an active layer along the first direction.

22. A lateral junction semiconductor device according to claim 21 wherein the first concentration and the tapering thickness are arranged to co-operate such that the concentration of excess charge carriers of first polarity within the gradation increases from a minimum of substantially zero.

23. A lateral junction semiconductor device according to claim 22 wherein the concentration of excess charge carriers of first polarity within the gradation varies substantially linearly from the minimum to a maximum along the first direction.

24. A lateral junction semiconductor device according to claim 21 wherein the semiconductor material within a second layer has an excess of charge carriers of a second polarity at a second concentration, the first and second concentrations and the tapering thickness being arranged to co-operate such that the concentration of excess charge carriers predominating within the active layer varies from those of the first polarity to those of the second polarity along the first direction.

25. A lateral junction semiconductor device according to claim 24 wherein the first and second concentrations and the tapering thickness are arranged to co-operate so as to provide within the active layer a region having substantially no excess carriers interposed along the first direction between a region having a predominance of excess charge carriers of first polarity and a region having a predominance of excess charge carriers of second polarity.

26. A lateral junction semiconductor device according to claim 25 comprising a semiconductor structure wherein the active layer is arranged between the first and second layers, and the band gap of the active layer is arranged to be less than the band gap of the first and second layers.

27. A lateral junction semiconductor device according to claim 26 wherein the active layer comprises a substantially intrinsic semiconductor material.

28. A lateral junction semiconductor device according to claim 26 wherein the semiconductor structure comprises a double heterostructure arranged in a quantum well configuration.

29. A lateral junction semiconductor device according to claim 21 wherein the tapering thickness imparts an outer surface to stack inclined at an angle to the planes of the layers there within.

30. A lateral junction semiconductor device according to claim 29 wherein the outer surface is inclined at an angle of $10^{-1}$-$10^{-5}$ radians to the planes of the layers within the stack.

31. A photon source having a lateral junction semiconductor device according to claim 21 further comprising a surface acoustic wave (SAW) transducer adapted, in use, to create a surface acoustic wave travelling along the first direction such that mobile charge carriers are transported by the surface acoustic wave along the first direction; and a gate adapted to control charge carrier transport caused by the surface acoustic wave such that the number of mobile charge carriers so transported can be controlled to the accuracy of a single carrier.

32. A photon source according to claim 31 comprising at least one of an electrical source and an optical source for introducing mobile carriers into the device.

33. A photon source according to claim 31 wherein the gate adapted to control the carrier transport comprises at least one of a biasable split gate and a quantum point contact.

* * * * *